United States Patent
Bouman et al.

(10) Patent No.: US 10,192,842 B2
(45) Date of Patent: Jan. 29, 2019

(54) PACKAGE FOR ENVIRONMENTAL PARAMETER SENSORS AND METHOD FOR MANUFACTURING A PACKAGE FOR ENVIRONMENTAL PARAMETER SENSORS

(71) Applicant: ams International AG, Rapperswil-Jona (CH)

(72) Inventors: Hendrik Bouman, Nijmegen (NL); Roel Daamen, Herkenbosch (NL); Coenraad Tak, Waalre (NL)

(73) Assignee: ams International AG, Rapperswil (CH)

( * ) Notice: Subject to any disclaimer, the term of this patent is extended or adjusted under 35 U.S.C. 154(b) by 0 days.

(21) Appl. No.: 14/566,309

(22) Filed: Dec. 10, 2014

(65) Prior Publication Data

US 2015/0171042 A1 Jun. 18, 2015

(30) Foreign Application Priority Data

Dec. 12, 2013 (EP) ..................................... 13196851

(51) Int. Cl.
*H01L 23/00* (2006.01)
*H01L 21/56* (2006.01)
(Continued)

(52) U.S. Cl.
CPC ............ *H01L 24/17* (2013.01); *G01D 11/245* (2013.01); *H01L 21/565* (2013.01); *H01L 23/3107* (2013.01); *H01L 23/3121* (2013.01); *H01L 24/32* (2013.01); *H01L 24/81* (2013.01); *H01L 24/83* (2013.01); *H01L 2224/13144* (2013.01); *H01L 2224/13155* (2013.01); *H01L 2224/16113* (2013.01); *H01L 2224/16225* (2013.01); *H01L 2224/16227* (2013.01); *H01L 2224/16245* (2013.01); *H01L 2224/48247* (2013.01); *H01L 2224/48465* (2013.01); *H01L 2224/81801* (2013.01); *H01L 2224/8385* (2013.01); *H01L 2224/83851* (2013.01); *H01L 2924/0132* (2013.01); *H01L 2924/12043* (2013.01); *H01L 2924/14* (2013.01); *H01L 2924/146* (2013.01); *H01L 2924/181* (2013.01);
(Continued)

(58) Field of Classification Search
CPC ......... H01L 27/00; H01L 23/00; H01L 21/56; H01L 23/31
See application file for complete search history.

(56) References Cited

U.S. PATENT DOCUMENTS 6,396,116 B1 * 5/2002 Kelly ................ H01L 27/14618
257/215
6,825,551 B1 * 11/2004 Do Bento Vieira ........................
H01L 23/3107
257/666
(Continued)

FOREIGN PATENT DOCUMENTS

CN 101103460 A 1/2008
CN 101256996 A 9/2008
(Continued)

*Primary Examiner* — Joseph C Nicely
*Assistant Examiner* — Lamont Koo
(74) *Attorney, Agent, or Firm* — Fish & Richardson P.C.

(57) ABSTRACT

A sensor package comprises a sensor chip bonded to an intermediate carrier, with the sensor element over an opening in the carrier. The package is for soldering to a board, during which the intermediate carrier protects the sensor part of the sensor chip.

11 Claims, 4 Drawing Sheets

(51) Int. Cl.
*H01L 23/31* (2006.01)
*G01D 11/24* (2006.01)
(52) U.S. Cl.
CPC ............... *H01L 2924/1815* (2013.01); *H01L 2924/20643* (2013.01); *H01L 2924/20644* (2013.01); *H01L 2924/20645* (2013.01)

(56) References Cited

U.S. PATENT DOCUMENTS

| | | | |
|---|---|---|---|
| 8,159,825 B1* | 4/2012 | Dotsenko | H03K 5/13 174/262 |
| 2004/0135243 A1* | 7/2004 | Aoyagi | H01L 23/5385 257/686 |
| 2004/0227223 A1* | 11/2004 | Sawamoto | 257/686 |
| 2005/0017342 A1* | 1/2005 | Morrison | H01L 23/49827 257/691 |
| 2005/0059188 A1* | 3/2005 | Bolken et al. | 438/106 |
| 2005/0153483 A1* | 7/2005 | Groenhuis | H01L 21/4828 438/124 |
| 2005/0189635 A1 | 9/2005 | Humpston et al. | |
| 2005/0279916 A1* | 12/2005 | Kang | H01L 27/14618 250/208.1 |
| 2006/0055061 A1 | 3/2006 | Hosokawa et al. | |
| 2007/0069354 A1 | 3/2007 | Dangelmaier et al. | |
| 2007/0152148 A1* | 7/2007 | Chao | H01L 27/14618 250/239 |
| 2008/0211095 A1 | 9/2008 | Nishizawa | |
| 2008/0258274 A1 | 10/2008 | Sinaga et al. | |
| 2009/0166784 A1 | 7/2009 | Honda | |
| 2009/0183999 A1* | 7/2009 | Ibarra | G01N 27/4071 205/775 |
| 2014/0070825 A1 | 3/2014 | Humbert et al. | |
| 2014/0077314 A1 | 3/2014 | Humbert et al. | |
| 2014/0102172 A1 | 4/2014 | Daamen et al. | |
| 2014/0170762 A1 | 6/2014 | Soccol et al. | |
| 2014/0191348 A1 | 7/2014 | Humbert et al. | |
| 2014/0202855 A1 | 7/2014 | Merz et al. | |
| 2014/0291842 A1* | 10/2014 | Ang | H01L 23/13 257/738 |

FOREIGN PATENT DOCUMENTS

| | | |
|---|---|---|
| CN | 101266851 A | 9/2008 |
| CN | 101322233 A | 12/2008 |
| CN | 101512765 A | 8/2009 |
| CN | 101616863 A | 12/2009 |
| EP | 2 743 677 A1 | 6/2014 |
| EP | 2 793 018 A1 | 10/2014 |
| WO | WO-2008089969 A2 | 7/2008 |
| WO | 2013/167466 A2 | 11/2013 |

* cited by examiner (a)

(b)

(c)

PACKAGE FOR ENVIRONMENTAL PARAMETER SENSORS AND METHOD FOR MANUFACTURING A PACKAGE FOR ENVIRONMENTAL PARAMETER SENSORS

CROSS-REFERENCE TO RELATED APPLICATIONS

This application claims the priority under 35 U.S.C. § 119 of European patent application no. 13196851.3, filed on Dec. 12, 2013, the contents of which are incorporated by reference herein.

FIELD

This application relates to sensor chip packages.

BACKGROUND

Quad flat packages are one example of surface mount integrated circuit package, in which gull wing leads extend from each of the four sides of the package. A modification which is aimed at providing improved miniaturisation, and which has been proposed for sensor packages, is a so-called Heatsink Very-thin Quad Flat-pack No-leads package (HVQFN). This is a package with no component leads extending from the package, and in which the package includes an integrated heat sink part. The package is for mounting on a printed circuit board by soldering, with other surface mount devices.

FIG. 1(a) shows a HVQFN package for soldering onto a PCB. The sensor chip 10 has pads 11 around the outer region of the top surface. In one example these pads connect to bond wires 14 which extend down to a carrier 12 such as a lead frame, which provides a fan out function. The bond wires are embedded in the package. The bond wires are connected by means of wirebonding. This is usually a "cold welding" process in the sense that the materials that are joined are not brought into the liquid state (as in real welding and soldering processes). A metallization is present on the bond pads when an IC is intended for wirebonding, and this is often aluminum or gold.

The lead frame 12 has outer contacts which are soldered to an underlying PCB 13, and a central die pad area beneath the chip 10. The central die pad area is also soldered to the PCB, and this solder region performs a heat sink function.

Instead of a lead frame, the carrier can for example be a laminate substrate.

The chip 10 carries one or more sensor elements 16. A HVQFN cavity package allows for the sensors on the chip to have an open access to the environment by providing package encapsulation with an opening through which the sensor area is exposed.

FIG. 1(b) shows a sensor chip with solder bumps 18 on the pads 11 which could be used to enable the chip to be mounted directly onto a PCB. A disadvantage of the package of FIG. 1(a) is that the package size is relatively large compared to the die size, as represented by arrows 20.

It is clear that a chip scale package (CSP) would be preferred from a size and cost point of view, for example by directly soldering the chip to a PCB.

However, the disadvantage of this approach for sensors is the risk of contamination from the CSP process, in particular the risk of solder splatter when solder bumps are reflow soldered when those solder bumps are attached at the wafer level, but also during the board soldering process at the customer side which might pollute the sensor area, and affect its functionality.

FIGS. 2 and 3 are used to illustrate the problems of soldering the chip directly to a PCB.

FIG. 2 shows how the sensor element 16 can be polluted by the CSP process when being prepared for soldering to a PCB, in particular when forming the solder balls 18. The process starts with a wafer, on which the bond pads 11 are formed, followed by an under bump metallisation. The solder balls are applied by a reflow process, which can give rise to the pollutant shown as 22.

The resulting package is then soldered at the customer side (i.e. a producer of electronic circuits rather than the individual components) to a PCB 13. The designer of the chip cannot know what level of cleaning will be applied at this stage, nor the quality of the solder paste and other materials used.

FIG. 3 shows how the sensor element 16 can be polluted by the solder reflow process when the package is mounted on the customer circuit board 13. The pollutant is shown as 26.

There is therefore a need for a sensor package which protects the sensor elements but which uses less space than the wire bond package of FIG. 1(a).

SUMMARY

The invention is defined by the claims.

According to an example, there is provided a sensor package, comprising:

an integrated circuit chip which carries at least one sensor element on a first surface;

an intermediate carrier having a first surface to which the first surface of the integrated circuit chip is bonded by an adhesive, wherein the intermediate carrier has an opening beneath the sensor element; and solder bond pads on a second surface of the intermediate carrier opposite the first surface.

The adhesive bonding avoids contamination from solder related processes when forming the package. The intermediate carrier provides protection for the sensor elements on the chip.

The package can be formed as a "near-CSP" (chip scale package) in that intermediate carrier area does not need to be significantly larger than the chip. The package uses an intermediate carrier with adhesive interconnects between the chip and the intermediate carrier.

For example, the outer shape defined by the outer edge of the intermediate carrier is preferably within 0.5 mm of the outer edge of the shape of the chip, more preferably within 0.4 mm and even more preferably within 0.3 mm.

This is possible because no space is required for wire bonds, for example. Despite the small package size, the intermediate carrier with a sensor opening provides protection for the sensor, for example when soldering the package to a customer PCB.

The integrated circuit chip can comprise gold bumps or Nickel gold bumps (i.e. electroless nickel bumps with a tiny gold protection layer to avoid oxidation), which are bonded to the first surface of the intermediate carrier by the adhesive. This is one way to avoid the use of soldering in the package manufacture.

The adhesive can comprise an anisotropic conductive glue or a non-conductive glue.

The opening can have a smaller area than the sensor area of the sensor element. In this way, the intermediate carrier acts as a barrier to protect the sensor, and only an opening large enough for the correct sensor operation is needed.

An overmoulding can optionally be provided over the integrated circuit chip to improve the robustness of the package.

A sensor device can comprise a circuit board and a sensor package, fixed to the circuit board by soldering of the solder bond pad to tracks on the circuit board.

An example also provides a method of manufacturing a sensor package, comprising:

providing an integrated circuit chip which carries at least one sensor element on a first surface; and bonding the first surface of the integrated circuit chip to a first surface of an intermediate carrier using an adhesive, wherein the intermediate carrier has an opening beneath the sensor element, wherein the intermediate carrier comprises solder bond pads on a second surface of the intermediate carrier opposite the fist surface.

BRIEF DESCRIPTION OF THE DRAWINGS

Examples will now be described in detail with reference to the accompanying drawings, in which.

DETAILED DESCRIPTION

This application relates to a sensor package with which a sensor chip is bonded to an intermediate carrier, with the sensor element above an opening or a set of openings in the carrier.

The package is for soldering to a board, during which the intermediate carrier protects the sensor part of the sensor chip.

Figures 1A, 1B:
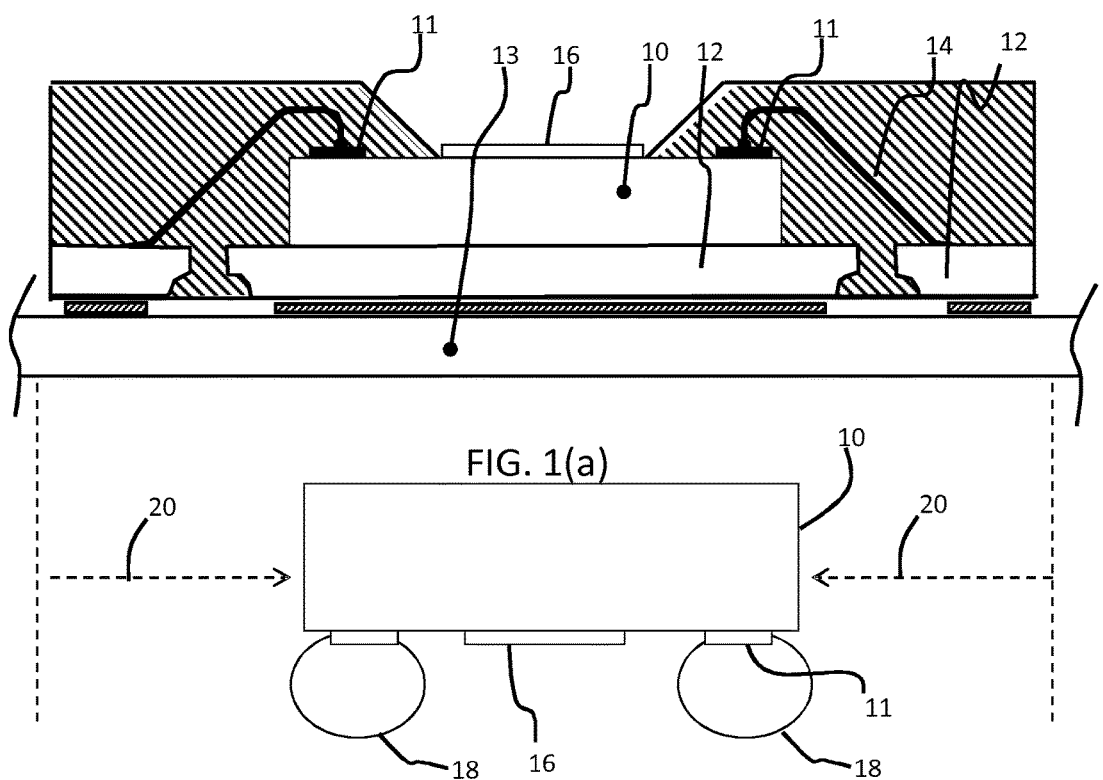
FIGS. 1(a) and 1(b) show a known HVQFN sensor package as well as a basic chip package (in FIG. 1(b) to enable a size comparison.
Figure 2:
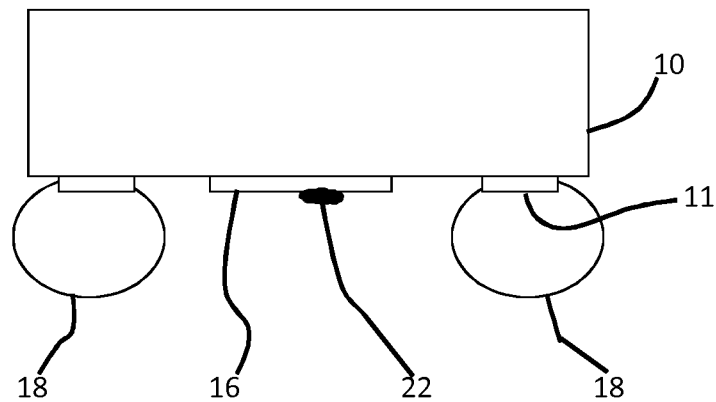
FIG. 2 shows a first contamination problem that can arise when a sensor chip is directly attached to a PCB.
Figure 3:
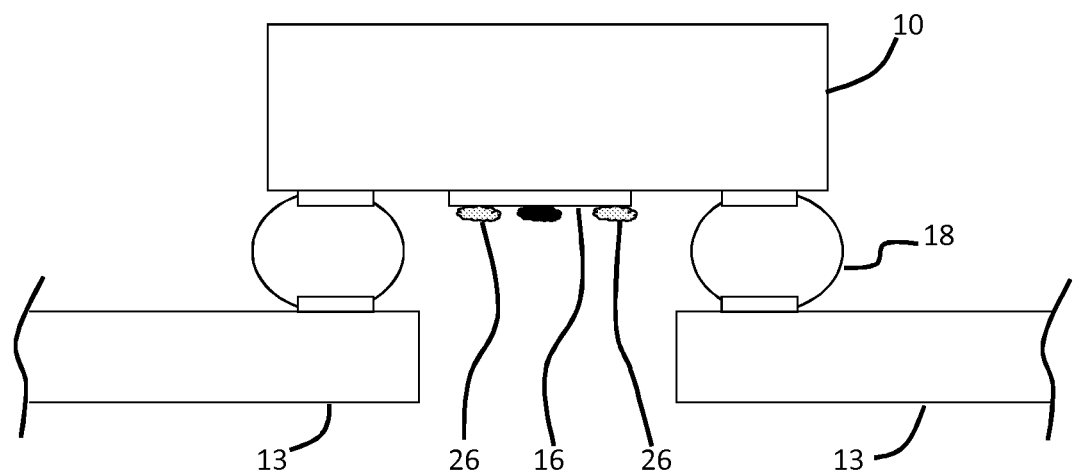
FIG. 3 shows a second contamination problem that can arise when a sensor chip is directly attached to a PCB.
Figure 4:
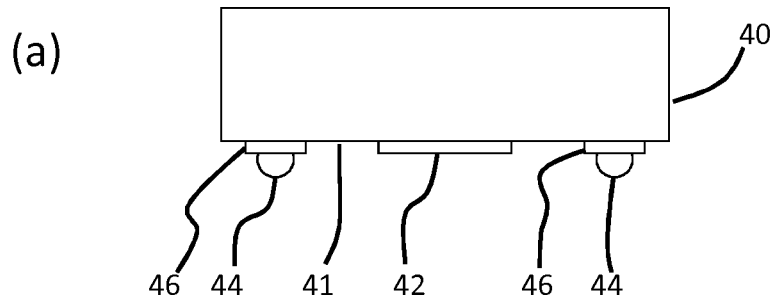
FIG. 4 shows an example of package and method for forming the package.
Figure 4:
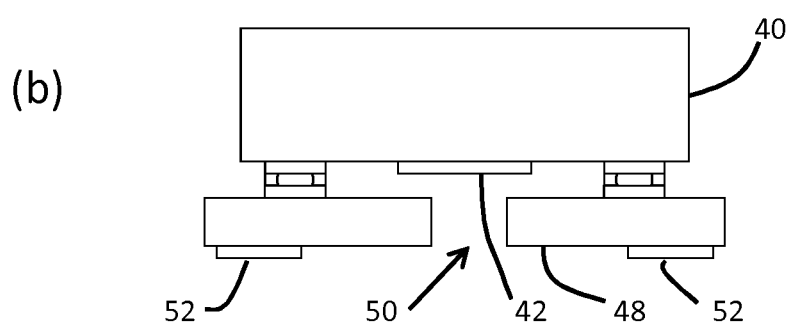
Figure 4:
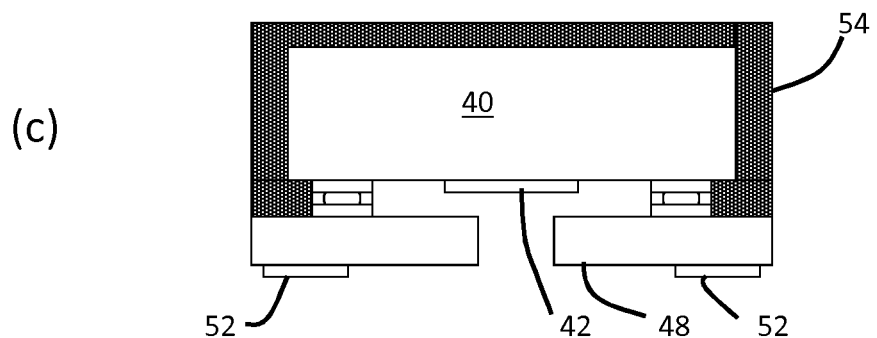

FIG. 4 shows a method of manufacturing a sensor package.

The method starts with the integrated circuit chip 40 which carries at least one sensor element 42 on a first surface 41. The first surface also carries metal bumps 44, for example of gold or Nickel gold or copper. These are each formed over a metal pad which defines the final input or output terminal of the chip, and an under bump metallisation layer is between the metal pad and the metal bump.

The first surface 41 of the integrated circuit chip 40 is bonded to a first surface of an intermediate carrier 48 using an adhesive, such as an anisotropic conductive adhesive (ACA) or a non conductive adhesive (NCA). The adhesive can be applied in the form of a tape or a paste. The intermediate carrier 48 has an opening 50 or a set of openings beneath the sensor element 42.

Note that there is generally no need for the sensor element sensor surface to be aligned with the opening. For example, the sensor may be a pressure sensor for which alignment is not required. Similarly, for chemical sensors, there is no need for direct alignment.

The intermediate carrier 48 comprises solder bond pads 52 on a second surface of the intermediate carrier opposite the fist surface. These are provided so that the overall package can be mounted on a printed circuit board as a surface mount device, simultaneously with the mounting of other surface mount components.

The area of the integrated circuit chip can for example be at least 60% of the area of the shape defined by the outer edge of the intermediate carrier 48, so that a near chip scale package is produced. The area can be at least 70% or even at least 80% of the carrier area.

Similarly, the outer shape defined by the outer edge of the intermediate carrier can be within 0.5 mm of the outer edge of the shape of the chip, more preferably within 0.4 mm and even more preferably within 0.3 mm. Again, this means the package size can be close to the chip size to assist miniaturisation and reduction of cost.

The opening 50 or set of openings can have a smaller area than the sensor area of the sensor element 42, and the intermediate carrier acts as a shield to protect the sensor element 42. The opening 50 can be as small as possible while allowing the sensor functionality.

The chip can then be overmoulded with a resin 54 to define the package. The intermediate carrier can comprise a laminate structure, and it provides the required electrical connections between the sensor chip terminals and the bond pads 52.

Figure 5:
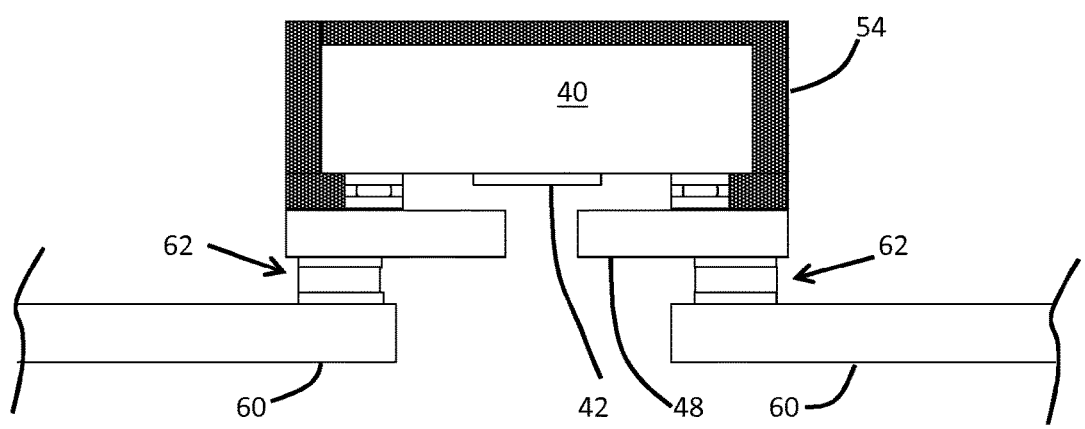
FIG. 5 shows the package of FIG. 4 attached to a circuit board.

FIG. 5 shows the sensor package soldered to a customer board 60 by solder connections 62. The intermediate carrier 52 protects the sensor elements during the customer soldering operation. In particular it provides tolerance to the quality of cleaning or other processing steps carried out by the customer, so that the connection of the sensor chip to the customer PCB is more reliable and easier to perform.

This example thus provides a near-CSP package which uses an intermediate carrier, which can be a laminate structure, and uses non-solder bumps as the interconnection between the chip and the intermediate carrier. In particular, to avoid contamination from CSP-processing, the solder is replaced by metal bumps (such as gold, nickel gold, copper or other metals) and the connection between the chip and the intermediate carrier is made using an adhesive.

These examples can be applied to sensors configured to detect various different variations in environmental parameters such as light, humidity, gas or liquid concentrations or pressure.

The chip and the package are typically square or rectangular.

Gold, gold nickel and copper bumps have been given as examples above. In combination with an adhesive, the most common example for this type of connection is gold bumps. Copper can be used, but there is a risk of oxidation. Electroless nickel or nickel gold bumps can also be considered.

The intermediate carrier essentially can comprise a printed circuit board structure, namely a laminate construction. The materials may be different to a conventional PCB. A BT (Bismaleimide-Triazine resin) laminate can for example be used, using a glass woven material core. Vertical interconnects can be formed in the laminate by drilled vias.

The same type of construction can be made with ceramics, for example a multilayer ceramic (using alumina or glass ceramic stacks that are sintered together).

One chip may carry a single sensor, although more than one sensor is common. A sensor device may even include an array of individual sensor electrodes.

The package size is typically in the range of 1 mm² to 10 mm². Typical sizes are thus in the range 1×1 mm to 3×3 mm.

The overmoudling compound can be an epoxy based molding compound. Silicon based molding compounds can also be used.

The opening in the carrier can be much smaller than the sensor electrode area. For example, it can have a linear dimension of less than 200 um, for example around 100 um.

The sensor package can be part of a sensor system, for example analytical equipment. It may also be provided as an additional function to another product such as a mobile phone. For example, pressure sensors are known for use as barometers within mobile phones, to provide altitude information to obtain a faster GPS coordinate fix. A microphone is also essentially a pressure sensor. Thus, the amount of space occupied by the sensor needs to be as low as possible when it is to be incorporated into a small product, and thus the reduction of floorspace enabled is of interest.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method of manufacturing a sensor package comprising:
   providing an integrated circuit chip which carries at least one sensor element on a first surface;
   bonding the first surface of the integrated circuit chip to a first surface of an intermediate carrier using an adhesive, the intermediate carrier comprising solder bond pads on a second surface of the intermediate carrier opposite the first surface; and
   soldering the solder bond pads to tracks of a circuit board,
   wherein the intermediate carrier has an opening beneath the at least one sensor element, the opening extending through the intermediate carrier,
   wherein the at least one sensor element is exposed to the environment through the opening,
   wherein the bonding comprises bonding the bumps to the first surface of the intermediate carrier,
   wherein the adhesive is an anisotropic conductive glue,
   wherein the use of soldering is avoided by the adhesive bonding of the integrated circuit chip,
   wherein the sensor package comprises a shield formed by the intermediate carrier, the shield configured and arranged to protect a sensor area of the at least one sensor element from pollution during the soldering when the sensor package is soldered to the circuit board, and
   wherein the outer shape defined by the outer edge of the intermediate carrier is within 0.5 mm of the outer edge of the shape of the chip and/or is within 0.4 mm and/or is within 0.3 mm.

2. A method of manufacturing a sensor package comprising:
   providing an integrated circuit chip which carries at least one sensor element on a first surface;
   bonding the first surface of the integrated circuit chip to a first surface of an intermediate carrier using an adhesive, the intermediate carrier comprising solder bond pads on a second surface of the intermediate carrier opposite the first surface; and
   soldering the solder bond pads to tracks of a circuit board,
   wherein the intermediate carrier has an opening beneath the at least one sensor element, the opening extending through the intermediate carrier,
   wherein the at least one sensor element is exposed to the environment through the opening,
   wherein the bonding comprises bonding the bumps to the first surface of the intermediate carrier,
   wherein the adhesive is an anisotropic conductive glue,
   wherein the use of soldering is avoided by the adhesive bonding of the integrated circuit chip,
   wherein the sensor package comprises a shield formed by the intermediate carrier, the shield configured and arranged to protect a sensor area of the at least one sensor element from pollution during the soldering when the sensor package is soldered to the circuit board,
   wherein an overmoulding over the integrated circuit chip defines the package, and
   wherein the outer shape defined by an outer edge of the overmoulding is within 0.5 mm of the outer edge of the shape of the chip and/or is within 0.4 mm of the outer edge of the shape of the chip and/or is within 0.3 mm of the outer edge of the shape of the chip.

3. A method of manufacturing a sensor package, comprising:
   providing an integrated circuit chip which carries at least one sensor element on a first surface;
   bonding the first surface of the integrated circuit chip to a first surface of an intermediate carrier using an adhesive, the intermediate carrier comprising solder bond pads on a second surface of the intermediate carrier opposite the first surface; and
   soldering the solder bond pads to tracks of a circuit board,
   wherein the intermediate carrier has an opening beneath the at least one sensor element, the opening extending through the intermediate carrier,
   wherein the at least one sensor element is exposed to the environment through the opening,
   wherein the bonding comprises bonding the bumps to the first surface of the intermediate carrier,
   wherein the adhesive is an anisotropic conductive glue,
   wherein the use of soldering is avoided by the adhesive bonding of the integrated circuit chip,
   wherein the sensor package comprises a shield formed by the intermediate carrier, the shield configured and arranged to protect a sensor area of the at least one sensor element from pollution during the soldering when the sensor package is soldered to the circuit board, and
   wherein the outer shape defined by the outer edge of the intermediate carrier is within 0.5 mm of the outer edge of the shape of the chip.

4. The method as claimed in claim 3, wherein the outer shape defined by the outer edge of the intermediate carrier is within 0.4 mm of the outer edge of the shape of the chip.

5. The method as claimed in claim 3, wherein the outer shape defined by the outer edge of the intermediate carrier is within 0.3 mm of the outer edge of the shape of the chip.

6. A method of manufacturing a sensor package, comprising:
   providing an integrated circuit chip which carries at least one sensor element on a first surface;
   bonding the first surface of the integrated circuit chip to a first surface of an intermediate carrier using an adhesive, the intermediate carrier comprising solder bond pads on a second surface of the intermediate carrier opposite the first surface; and soldering the solder bond pads to tracks of a circuit board, wherein the intermediate carrier has an opening beneath the at least one sensor element, the opening extending through the intermediate carrier, wherein the at least one sensor element is exposed to the environment through the opening, wherein the bonding comprises bonding the bumps to the first surface of the intermediate carrier, wherein the adhesive is an anisotropic conductive glue, wherein the use of soldering is avoided by the adhesive bonding of the integrated circuit chip, wherein the sensor package comprises a shield formed by the intermediate carrier, the shield configured and arranged to protect a sensor area of the at least one sensor element from pollution during the soldering when the sensor package is soldered to the circuit board, wherein an overmoulding over the integrated circuit chip defines the package, and wherein the outer shape defined by an outer edge of the overmoulding is within 0.5 mm of the outer edge of the shape of the chip.

7. The method as claimed in claim 6, wherein the outer shape defined by an outer edge of the overmoulding is within 0.4 mm of the outer edge of the shape of the chip.

8. The method as claimed in claim 6, wherein the outer shape defined by an outer edge of the overmoulding is within 0.3 mm of the outer edge of the shape of the chip.

9. The method as claimed in one of claims 3 to 8, wherein the intermediate carrier has a set of openings beneath the at least one sensor element.

10. The method as claimed in one of claims 3 to 8, wherein the opening extends from the first surface of the intermediate carrier through the intermediate carrier to the second surface of the intermediate carrier.

11. The method as claimed in one of claims 3 to 8, wherein the intermediate carrier consists of a single piece of material and the opening extends through the single piece of material.

* * * * *